(12) United States Patent
Wang et al.

(10) Patent No.: US 12,400,957 B2
(45) Date of Patent: Aug. 26, 2025

(54) GEOMETRIC SEMICONDUCTOR MEMORY STRUCTURE AND MANUFACTURING METHOD THEREOF

(71) Applicants: CHANGXIN MEMORY TECHNOLOGIES, INC., Hefei (CN); BEIJING SUPERSTRING ACADEMY OF MEMORY TECHNOLOGY, Beijing (CN)

(72) Inventors: Xiaoguang Wang, Hefei (CN); Dinggui Zeng, Hefei (CN); Huihui Li, Hefei (CN); Jiefang Deng, Hefei (CN); Kanyu Cao, Hefei (CN)

(73) Assignees: CHANGXIN MEMORY TECHNOLOGIES, INC., Hefei (CN); BEIJING SUPERSTRING ACADEMY OF MEMORY TECHNOLOGY, Beijing (CN)

( * ) Notice: Subject to any disclaimer, the term of this patent is extended or adjusted under 35 U.S.C. 154(b) by 533 days.

(21) Appl. No.: 17/808,797

(22) Filed: Jun. 24, 2022

(65) Prior Publication Data
US 2023/0094859 A1     Mar. 30, 2023

Related U.S. Application Data

(63) Continuation of application No. PCT/CN2022/078665, filed on Mar. 1, 2022.

(30) Foreign Application Priority Data

Sep. 28, 2021   (CN) .......................... 202111144928.3

(51) Int. Cl.
*H01L 23/528* (2006.01)
*H10B 53/00* (2023.01)
(Continued)

(52) U.S. Cl.
CPC ......... *H01L 23/5283* (2013.01); *H10B 53/00* (2023.02); *H10B 61/22* (2023.02); *H10B 63/30* (2023.02)

(58) Field of Classification Search
CPC ..... H01L 23/5283; H10B 61/22; H10B 53/00; H10B 63/30
(Continued)

(56) References Cited

U.S. PATENT DOCUMENTS 6,567,300 B1   5/2003   Raberg et al.
7,582,889 B2   9/2009   Asano
(Continued)

FOREIGN PATENT DOCUMENTS

| CN | 1639796 A | 7/2005 |
|---|---|---|
| CN | 103155139 A | 6/2013 |

(Continued)

OTHER PUBLICATIONS

TW Office Action cited in TW111131544, mailed Oct. 12, 2023, 14 pages.
(Continued)

*Primary Examiner* — Eric W Jones
(74) *Attorney, Agent, or Firm* — Kilpatrick Townsend & Stockton LLP

(57) ABSTRACT

The present disclosure relates to a semiconductor structure and a manufacturing method thereof. The semiconductor structure includes: a substrate, having a first surface; a plurality of memory cells, located on the first surface of the substrate and arranged according to a first preset pattern; and a plurality of memory contact structures, corresponding to the memory cells in a one-to-one manner, where bottom portions of the memory contact structures are in contact with top portions of the memory cells, and top portions of the memory contact structures are arranged according to a
(Continued)

second preset pattern. The bottom portion of the memory contact structure is arranged opposite to the top portion of the memory contact structure.

16 Claims, 6 Drawing Sheets

(51) Int. Cl.
  *H10B 61/00* (2023.01)
  *H10B 63/00* (2023.01)
(58) Field of Classification Search
  USPC .......................................................... 257/314
  See application file for complete search history.

(56) References Cited

U.S. PATENT DOCUMENTS

| | | | |
|---|---|---|---|
| 9,425,057 B2 | 8/2016 | Cho et al. | |
| 9,899,399 B2 | 2/2018 | Ogawa et al. | |
| 10,049,711 B2 | 8/2018 | Nakatsuka et al. | |
| 2016/0379701 A1* | 12/2016 | Nakatsuka | H10N 50/80 365/51 |
| 2023/0380191 A1* | 11/2023 | Wang | H10B 53/10 |

FOREIGN PATENT DOCUMENTS

| | | |
|---|---|---|
| CN | 105448927 A | 3/2016 |
| CN | 106104790 A | 11/2016 |
| CN | 108040501 A | 5/2018 |
| CN | 112582372 A | 3/2021 |
| JP | 2007149913 A | 6/2007 |
| TW | I322499 B | 3/2010 |

OTHER PUBLICATIONS

International Search Report cited in PCT/CN2022/078665 mailed May 20, 2022, 9 pages.

* cited by examiner

GEOMETRIC SEMICONDUCTOR MEMORY STRUCTURE AND MANUFACTURING METHOD THEREOF

CROSS-REFERENCE TO RELATED APPLICATIONS

The present disclosure is a continuation application of International Patent Application No. PCT/CN2022/078665, filed on Mar. 1, 2022, which claims the priority to Chinese Patent Application 202111144928.3, titled "SEMICONDUCTOR STRUCTURE AND MANUFACTURING METHOD THEREOF" and filed with China National Intellectual Property Administration (CNIPA) on Sep. 28, 2021. The entire contents of International Patent Application No. PCT/CN2022/078665 and Chinese Patent Application 202111144928.3 are incorporated herein by reference.

TECHNICAL FIELD

The present disclosure relates to the technical field of integrated circuits, and in particular to a semiconductor structure and a manufacturing method thereof.

BACKGROUND

Non-volatile memories, with the characteristics of high read/write speed, low power consumption, anti-radiation, and long data retention time, are irreplaceable in the field with high reliability requirements, such as national defense and aerospace.

With the development of semiconductor technology, the non-volatile memory is required to have higher capacity. In order to increase the capacity of the non-volatile memory, it is necessary to arrange memory cells densely. However, the dense arrangement of memory cells limits the shape of the bit line structure and increases the production cost and process difficulty of the non-volatile memory. How to reduce the production cost and process difficulty of the non-volatile memory is an urgent problem to be solved.

SUMMARY

A semiconductor structure is provided, including:

a substrate, having a first surface;

a plurality of memory cells, located on the first surface of the substrate and arranged according to a first preset pattern; and a plurality of memory contact structures, corresponding to the memory cells in a one-to-one manner, where bottom portions of the memory contact structures are in contact with top portions of the memory cells, and top portions of the memory contact structures are arranged according to a second preset pattern;

where the bottom portion of the memory contact structure is arranged opposite to the top portion of the memory contact structure.

A manufacturing method of a semiconductor structure is provided, including:

providing a substrate, where the substrate has a first surface;

forming a plurality of memory cells on the first surface of the substrate, where the memory cells are arranged according to a first preset pattern; and forming memory contact structures on top portions of the memory cells respectively, where top portions of the memory contact structures are arranged according to a second preset pattern.

BRIEF DESCRIPTION OF THE DRAWINGS

To describe the technical solutions in the embodiments of the present disclosure or in the conventional art more clearly, the following briefly describes the accompanying drawings required for describing the embodiments or the conventional art. Apparently, the accompanying drawings in the following description show merely some embodiments of the present disclosure, and a person of ordinary skill in the art may still derive other accompanying drawings from these accompanying drawings without creative efforts.

DETAILED DESCRIPTION

Figure 1:
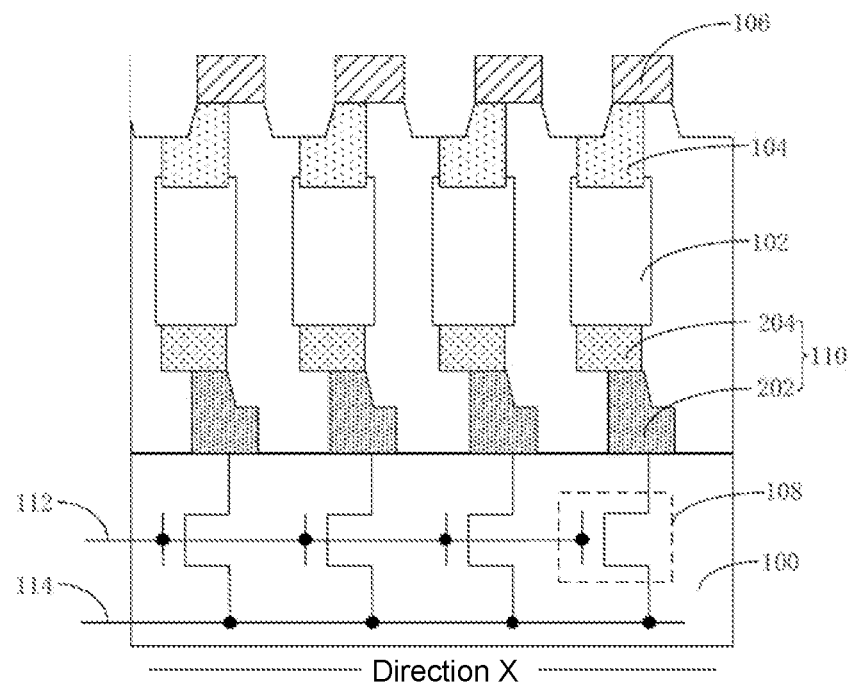
FIG. 1 is a schematic cross-sectional diagram of a semiconductor structure according to an embodiment.

To facilitate the understanding of the present disclosure, the present disclosure will be described more completely below with reference to the accompanying drawings. The embodiments of the present disclosure are shown in the drawings. However, the present disclosure may be embodied in various forms without being limited to the embodiments described herein. These embodiments are provided in order to make the present disclosure more thorough and comprehensive.

Unless otherwise defined, all technical and scientific terms used herein have the same meaning as commonly understood by those skilled in the technical field of the present disclosure. The terms mentioned herein are merely for the purpose of describing specific embodiments, rather than to limit the present disclosure.

It should be understood that when an element or a layer is described as "being on", "being adjacent to", "being connected to" or "being coupled to" another element or layer, it can be on, adjacent to, connected to, or coupled to the another element or layer directly, or intervening elements or layers may be present. On the contrary, when an element is described as "being directly on", "being directly adjacent to", "being directly connected to" or "being directly coupled to" another element or layer, there are no intervening elements or layers. It should be understood that although terms such as first, second, and third may be used to describe various elements, components, regions, layers, doping types and/or sections, these elements, components, regions, layers, doping types and/or sections should not be limited by these terms. These terms are only used to distinguish one element, component, region, layer, doped type or section from another element, component, region, layer, doped type or section. Therefore, without departing from the teachings of the present disclosure, a first element, component, region, layer, doping type or section discussed below may be a second element, component, region, layer, doping type or section. For example, the first doping type may be the second doping type, and similarly, the second doping type may be the first doping type; or the first doping type and the second doping type are different doping types, for example, the first doping type may be P-type and the second doping type may be N-type, or the first doping type may be N-type and the second doping type may be P-type.

Spatial relationship terms such as "under", "beneath", "lower", "below", "above", and "upper" can be used herein to describe the relationship shown in the figure between one element or feature and another element or feature. It should be understood that in addition to the orientations shown in the figure, the spatial relationship terms further include different orientations of used and operated devices. For example, if a device in the accompanying drawings is turned over and described as being "beneath another element", "below it", or "under it", the device or feature is oriented "on" the another element or feature. Therefore, the exemplary terms "beneath" and "under" may include two orientations of above and below. In addition, the device may further include other orientations (for example, a rotation by 90 degrees or other orientations), and the spatial description used herein is interpreted accordingly.

In the specification, the singular forms of "a", "an" and "the/this" may also include plural forms, unless clearly indicated otherwise. It should also be understood that the terms such as "including/comprising" and "having" indicate the existence of the stated features, wholes, steps, operations, components, parts or combinations thereof. However, these terms do not exclude the possibility of the existence of one or more other features, wholes, steps, operations, components, parts or combinations thereof. In this case, in this specification, the term "and/or" includes any and all combinations of related listed items.

The magnetic random access memory (MRAM) is a non-volatile memory. A memory cell of a memory cell in the MRAM includes a top electrode, a bottom electrode, and a magnetic material located between the top and bottom electrodes. By passing a current between the top and bottom electrodes of a target memory cell, data is written into the memory cell. The current flowing through the memory cell generates a magnetic field that can cause erroneous writes into non-target memory cells with a specific probability. The probability of an erroneous write depends on the coercive force of the memory cell (tolerance to external magnetic fields) and the magnitude of the magnetic field. The magnitude of the magnetic field is proportional to the reciprocal of the distance between the target memory cell and the affected non-target memory cell.

In order to improve the integration of memory cells in the MRAM while ensuring the accuracy of data writing, the arrangement of memory cells in the MRAM and their impact on the shape or position of device structures on top of the memory cells determine the production cost and process difficulty of the MRAM.

FIG. 1 is a schematic cross-sectional diagram of a semiconductor structure according to an embodiment. Referring to FIG. 1, a semiconductor structure provided by this embodiment includes: a substrate 100, a plurality of memory cells 102, and a plurality of memory contact structures 104. The substrate 100 has a first surface; the memory cells 102 are located on the first surface of the substrate 100 and are arranged according to a first preset pattern. That is, the memory cells 102 are arranged on the first surface of the substrate 100 according to the first preset pattern. The memory contact structures 104 are located on the memory cells 102, and correspond in a one-to-one manner to the memory cells 102 on the substrate 100, and bottom portions of the memory contact structures 104 are in contact with top portions of the memory cells 102. The top portions of the memory contact structures 104 are arranged according to a second preset pattern. That is, the top portions of the memory contact structures 104 on the memory cells 102 are arranged according to the second preset pattern; the second preset pattern and the first preset pattern are different patterns. The bottom portion of the memory contact structure 104 is arranged opposite to the top portion of the memory contact structure 104. That is, the bottom portion of the memory contact structure 104 is parallel to the top portion of the memory contact structure 104.

The semiconductor structure includes a plurality of memory cells 102, located on the first surface of the substrate 100 and arranged according to the first preset pattern; and a plurality of memory contact structures 104, corresponding to the memory cells 102 in a one-to-one manner, where the bottom portions of the memory contact structures 104 are in contact with the top portions of the memory cells 102, and the top portions of the memory contact structures 104 are arranged according to the second preset pattern. Through such a configuration, device structures arranged according to the second preset pattern can be formed on the memory cells 102 arranged according to the first preset pattern, which eliminates the impact of the arrangement shape of the memory cells 102 on the arrangement or shape of the device structures formed on the memory cells 102, thus reducing the process difficulty and the production cost.

Figure 2:
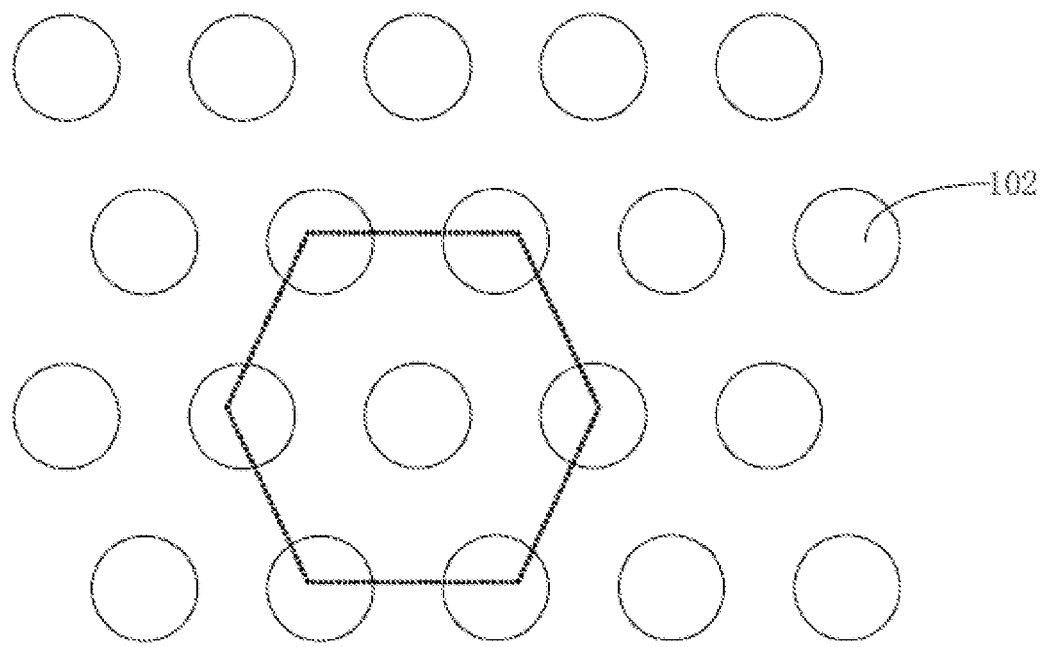
FIG. 2 is a schematic top view of memory cells in a semiconductor structure after the memory cells are formed according to an embodiment.

FIG. 2 is a schematic top view of memory cells in a semiconductor structure after the memory cells 102 are formed according to an embodiment. As shown in FIG. 2, in an embodiment, the first preset pattern includes a regular hexagon, and the memory cells 102 are located at vertex positions and a central position of the regular hexagon.

In an embodiment, the bottom portions of the memory contact structure 104 are arranged according to the first preset pattern.

In an embodiment, an area of the bottom portion of the memory contact structure 104 is larger than that of the top portion of the memory cell 102. In other embodiments, the area of the bottom portion of the memory contact structure 104 is smaller than or equal to the area of the top portion of the memory cell 102. Such a configuration allows the memory contact structure 104 to be in close contact with the memory cell 102 while avoiding damage to the memory cell 102 in the process of forming the memory contact structure 104.

In an embodiment, a material of the memory contact structure 104 includes one or more selected from a group consisting of polysilicon, a metal, a conductive metal nitride, a conductive metal oxide, and a metal silicide. The metal may be tungsten (W), nickel (Ni), or titanium (Ti); the conductive metal nitride includes titanium nitride (TiN); the conductive metal oxide includes iridium oxide ($IrO_2$); the metal silicide includes titanium silicide (TiSi).

Figure 3:
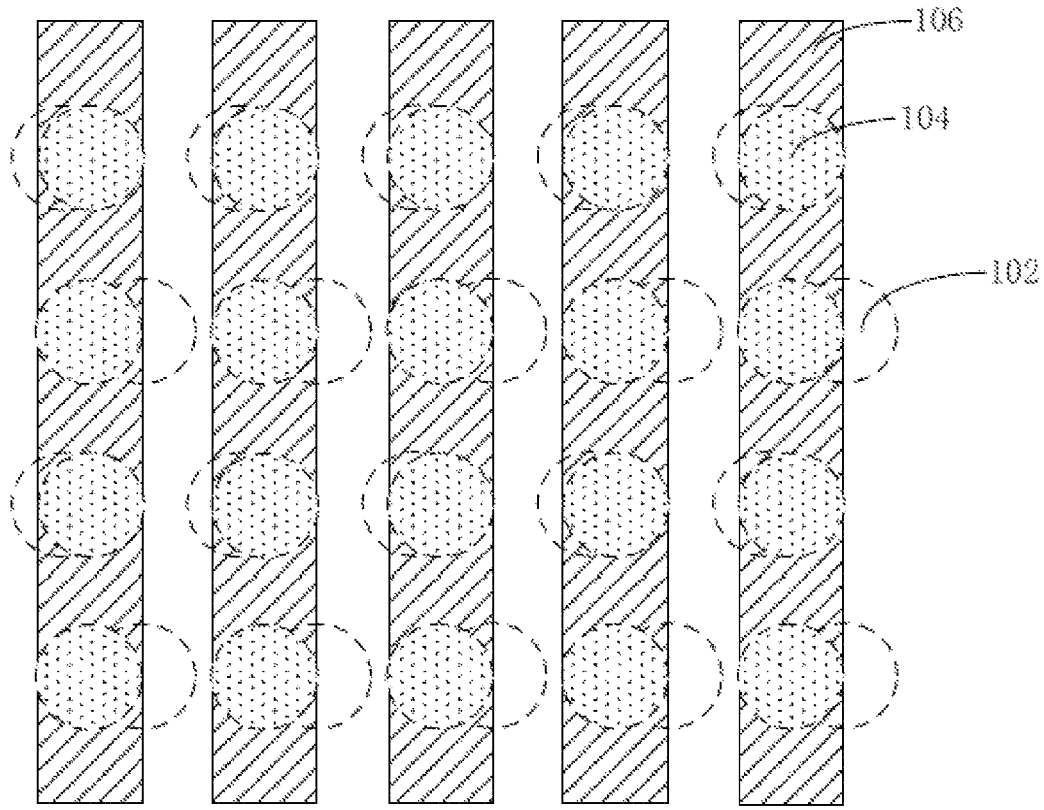
FIG. 3 is a schematic top view of a semiconductor structure according to an embodiment.

FIG. 3 is a schematic top view of a semiconductor structure according to an embodiment. As shown in FIG. 3, in an embodiment, the second preset pattern includes an array with a plurality of rows and columns.

Further referring to FIG. 1, in an embodiment, the semiconductor structure further includes: a plurality of bit line structures 106, where any one of the bit line structures 106 is in contact with the top portion of the memory contact structure 104 in a same column, and the bit line structure 106 is a straight-line shape. For example, a length of the bit line structure 106 along a direction X is not less than a length of the top portion of the memory contact structure 104 along the direction X, where the direction X intersects with an extension direction of the bit line structure 106.

Further referring to FIG. 1, in an embodiment, the semiconductor structure further includes: a plurality of transistors 108 and a plurality of transistor contact structures 110. The transistors 108 are located between the substrate 100 and the memory cells 102, and correspond to the memory cells 102 in a one-to-one manner. The transistor contact structures 110 are located between the transistors 108 and the memory cells 102, and are in contact with the transistors 108 and the memory cells 102. The top portions of the transistor contact structures 110 are arranged according to the first preset pattern.

In an embodiment, the transistors 108 are arranged according to a third preset pattern. It may be understood that, the third preset pattern includes the first preset pattern and the second preset pattern. In practical application, the arrangement shape of the transistors 108 may be set as required. For example, when the transistors 108 are arranged according to the first preset pattern, the transistors 108 and the memory cells 102 are arranged in the same manner. When the transistors 108 are arranged according to the second preset pattern, the transistors 108 and the memory contact structures 104 are arranged in the same manner.

In an embodiment, bottom portions of the transistor contact structures 110 are arranged according to the third preset pattern. The bottom portion of the transistor contact structure 110 is arranged opposite to a top portion of the transistor contact structure 110. The third preset pattern includes the first preset pattern and the second preset pattern.

In an embodiment, an area of the top portion of the transistor contact structure 110 is larger than that of the bottom portion of the memory cell 102. In other embodiments, the area of the top portion of the transistor contact structure 110 is smaller than or equal to that of the bottom portion of the memory cell 102, so as to eliminate impact of the process deviation on the contact resistance between the transistor contact structure 110 and the memory cell 102.

Further referring to FIG. 1, in an embodiment, the transistor contact structures 110 each include: a first lead-out structure 202 and a second lead-out structure 204. A bottom portion of the first lead-out structure 202 is in contact with the transistor 108 to lead out the transistor 108. For example, the bottom portion of the first lead-out structure 202 is connected to a drain of the transistor 108, to lead out the drain of the transistor 108. Typically, an area of the bottom portion of the first lead-out structure 202 is equal to that of the drain of the transistor 108. A bottom portion of the second lead-out structure 204 is in contact with a top portion of the first lead-out structure 202. The bottom portion of the first lead-out structure 202 is arranged opposite to the top portion of the first lead-out structure 202, and the bottom portion of the second lead-out structure 204 is arranged opposite to the top portion of the second lead-out structure 204. The bottom portion of the first lead-out structure 202 is the bottom portion of the transistor contact structure 110, and the top portion of the second lead-out structure 204 is the top portion of the transistor contact structure 110. In this case, the bottom portions of the first lead-out structures 202 are arranged according to the third preset pattern, and the top portions of the second lead-out structures 204 are arranged according to the first preset pattern. For example, the bottom portions of the first lead-out structure 202 are arranged according to the second preset pattern, and the top portions of the second lead-out structure 204 are arranged according to the first preset pattern; alternatively, the bottom portions of the first lead-out structure 202 and the top portions of the second lead-out structures 204 are both arranged according to the first preset pattern.

In an embodiment, an area of the bottom portion of the second lead-out structure 204 is not smaller than that of the top portion of the first lead-out structure 202.

In an embodiment, a portion of the first lead-out structure 202 which is close to the bottom portion of the second lead-out structure 204 is a trapezoidal structure.

In an embodiment, a material of the first lead-out structure 202 and the second lead-out structure 204 includes one or more selected from a group consisting of polysilicon, a metal, a conductive metal nitride, a conductive metal oxide, and a metal silicide. The metal may be tungsten (W), nickel (Ni), or titanium (Ti); the conductive metal nitride includes titanium nitride (TiN); the conductive metal oxide includes iridium oxide ($IrO_2$); the metal silicide includes titanium silicide (TiSi). For example, the material of at least one of the memory contact structure 104, the first lead-out structure 202, and the second lead-out structure 204 is different from others. For example, the material of the first lead-out structure 202 is different from the material of the memory contact structure 104 and the second lead-out structure 204. In practical application, a same material may be selected as required to manufacture the memory contact structure 104, the first lead-out structure 202, and the second lead-out structure 204.

In an embodiment, the memory cell 102 includes a ferroelectric memory cell, a magnetoresistive memory cell, a resistance change memory cell, or a phase change memory cell.

Figure 4:
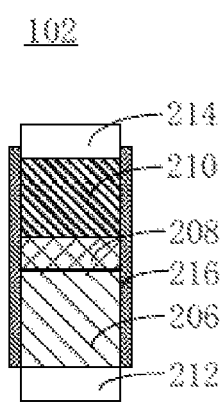
FIG. 4 is a schematic cross-sectional diagram of a memory cell according to an embodiment.

FIG. 4 is a schematic cross-sectional diagram of a memory cell 102 according to an embodiment. As shown in FIG. 4, in this embodiment, the memory cell 102 is a magnetoresistive memory cell. The memory cell 102 includes: a fixed layer 206, a non-magnetic isolation layer 208, and a free layer 210. The fixed layer 206 is located at the bottom portion of the memory cell 102. That is, the fixed layer 206 is connected to the transistor contact structure 110 and has a magnetic field of a preset direction. Compared with the free layer 210, the fixed layer 206 has a relatively large film thickness and relatively strong magnetic properties, and the magnetic torque is not easily reversed. For example, the material of the fixed layer 206 includes CoFe and CoFeB. Typically, the fixed layer 206 is a laminated structure consisting of multiple films. The laminated structure includes a seed layer, a [Co(x)/Pt(y)]$_m$ laminated layer, a Ru or Ir metal layer, a [Co(x)/Pt(y)]$_m$ laminated layer, a Ta metal layer, and a CoFeB metal layer in sequence from bottom to top. The non-magnetic isolation layer 208 is located between the free layer 210 and the fixed layer 206, to isolate the fixed layer 206 from the free layer 210. For example, the material of the non-magnetic isolation layer 208 includes MgO and Al$_2$O$_3$. The free layer 210 is made of a soft ferromagnetic material, which has low coercivity, high magnetic permeability, and high sensitivity to low magnetic fields. The free layer 210 has weak magnetic properties and the magnetic torque is easily reversed. For example, the material of the free layer 210 includes CoFe, NiFe, NiFeCo, and CoFeB.

The magnetoresistive memory cell is a current-controlled element, where a magnetization direction of the free layer 210 is controlled by a current flowing through the memory cell 102. When the magnetization direction of the free layer 210 is the same as that of the fixed layer 206, the memory cell 102 is in a low-resistance state, and the memory cell 102 stores data "0". When the magnetization direction of the free layer 210 is opposite to that of the fixed layer 206, the memory cell 102 is in a high-resistance state, and the memory cell 102 stores data "1".

Further referring to FIG. 4, in an embodiment, the memory cell 102 further includes a bottom electrode 212, which is located on an upper surface of the transistor contact structure 110. It may be understood that, in some embodiments, the second lead-out structure 204 may also be used as the bottom electrode 212 of the memory cell 102.

Further referring to FIG. 4, in an embodiment, the memory cell 102 further includes a top electrode 214, which is located on an upper surface of the free layer 210. It may be understood that, in some embodiments, the memory contact structure 104 may also be used as the top electrode 214 of the memory cell 102.

Further referring to FIG. 4, in other embodiments, the memory cell 102 further includes a protective layer 216, covering a sidewall of the fixed layer 206, and the sidewall of the fixed layer 206 extends to cover the sidewall of the free layer 210. For example, a material of the protective layer 216 is silicon nitride.

Further referring to FIG. 1, in an embodiment, the semiconductor structure further includes: a plurality of word line structures 112 and a plurality of global source lines 114, where the word line structure 112 is connected to a gate of the transistor 108, and the global source line 114 is connected to a source of the transistor 108.

Figure 5:
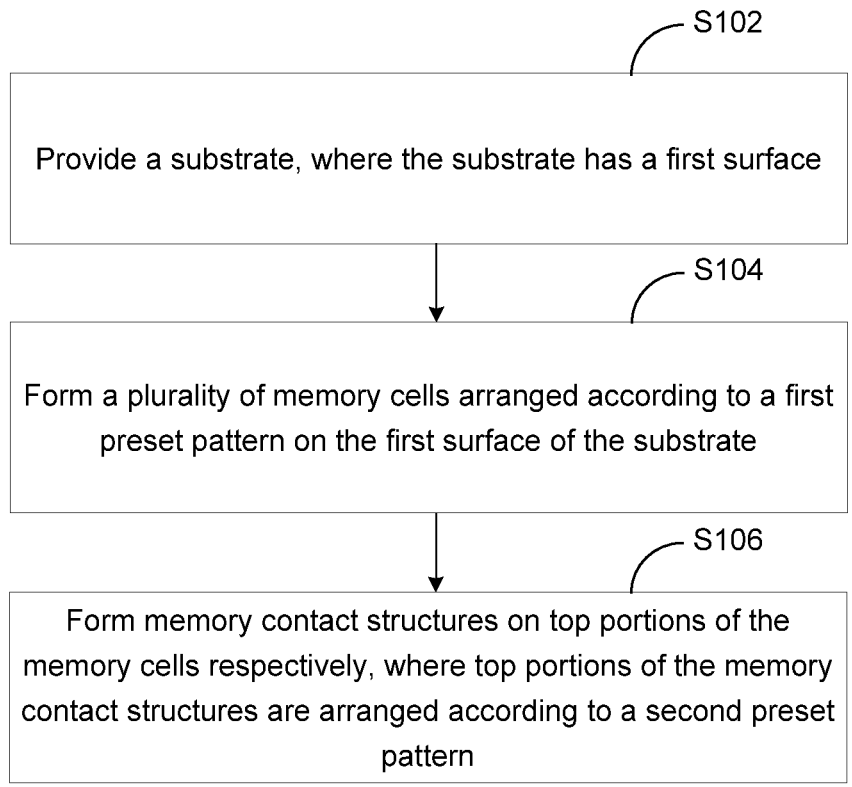
FIG. 5 is a schematic flowchart of a manufacturing method of a semiconductor structure according to an embodiment.

FIG. 5 is a schematic flowchart of a manufacturing method of a semiconductor structure according to an embodiment. As shown in FIG. 1 and FIG. 5, the present disclosure further provides a manufacturing method of a semiconductor structure, including the following steps.

S102: Provide a substrate, where the substrate has a first surface.

S104: Form a plurality of memory cells arranged according to a first preset pattern on the first surface of the substrate.

As shown in FIG. 1, a plurality of memory cells 102 are formed on the first surface of the substrate 100, and the memory cells 102 are arranged on the first surface of the substrate 100 according to the first preset pattern.

S106: Form memory contact structures on top portions of the memory cells respectively, where top portions of the memory contact structures are arranged according to a second preset pattern.

Specifically, the memory contact structures 104 are formed on the memory cells 102 respectively. Bottom portions of the memory contact structures 104 are in contact with the top portions of the memory cell 102. The top portions of the memory contact structures 104 are arranged according to the second preset pattern. The second preset pattern and the first preset pattern are different patterns. The bottom portion of the memory contact structure 104 is arranged opposite to the top portion of the memory contact structure 104. That is, the bottom portion of the memory contact structure 104 is parallel to the top portion of the memory contact structure 104.

The foregoing manufacturing method of a semiconductor structure includes providing a substrate 100 having a first surface, forming a plurality of memory cells 102 arranged according to a first preset pattern on the first surface of the substrate 100, and forming memory contact structures 104 on top portions of the memory cells 102 respectively, where top portions of the memory contact structures 104 are arranged according to a second preset pattern. Through such a configuration, device structures arranged according to the second preset pattern can be formed on the memory cells 102 arranged according to the first preset pattern, which eliminates the impact of the arrangement shape of the memory cells 102 on the arrangement or shape of the device structures formed on the memory cells 102, thus reducing the process difficulty and the production cost.

As shown in FIG. 2, in an embodiment, the first preset pattern includes a regular hexagon, and the memory cells 102 are located at vertex positions and a central position of the regular hexagon.

In an embodiment, the bottom portion of the memory contact structure 104 is in contact with the top portion of the memory cell 102, and the bottom portions of the memory contact structures 104 are arranged according to the first preset pattern.

In an embodiment, an area of the bottom portion of the memory contact structure 104 is larger than an area of the top portion of the memory cell 102. In other embodiments, the area of the bottom portion of the memory contact structure 104 is smaller than or equal to the area of the top portion of the memory cell 102. Such a configuration allows the memory contact structure 104 to be in close contact with the memory cell 102 while avoiding damage to the memory cell 102 in the process of forming the memory contact structure 104.

In an embodiment, a material of the memory contact structure 104 includes one or more selected from a group consisting of polysilicon, a metal, a conductive metal nitride, a conductive metal oxide, and a metal silicide. The metal may be tungsten (W), nickel (Ni), or titanium (Ti); the conductive metal nitride includes titanium nitride (TiN); the conductive metal oxide includes iridium oxide (IrO$_2$); the metal silicide includes titanium silicide (TiSi).

As shown in FIG. 3, in an embodiment, the second preset pattern includes an array with a plurality of rows and columns.

Further referring to FIG. 1, in an embodiment, the manufacturing method of a semiconductor structure further includes:

forming a plurality of bit line structures 106 on the top portions of the memory contact structures 104 respectively, where any one of the bit line structures 106 is in contact with the top portion of the memory contact structure 104 in a same column, and the bit line structure 106 is a straight-line shape. For example, a length of the bit line structure 106 along a direction X is not less than a length of the top portion of the memory contact structure 104 along the direction X, where the direction X intersects with an extension direction of the bit line structure 106.

Figure 6:
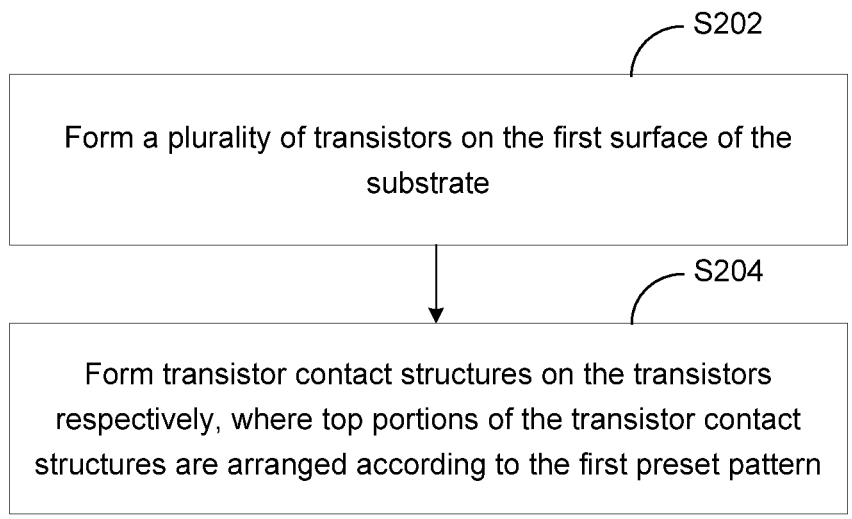
FIG. 6 is a schematic flowchart of a manufacturing method of a semiconductor structure according to another embodiment.

FIG. 6 is a schematic flowchart of a manufacturing method of a semiconductor structure according to another embodiment. As shown in FIG. 1 and FIG. 6, in an embodiment, before step S104, the method further includes the following steps:

S202: Form a plurality of transistors on the first surface of the substrate.

Specifically, a plurality of transistors 108 are formed on the first surface of the substrate 100, where the transistors 108 correspond to the memory cells 102 in a one-to-one manner. In an embodiment, the transistors 108 are arranged according to a third preset pattern. It may be understood that, the third preset pattern includes the first preset pattern and the second preset pattern. In practical application, the arrangement shape of the transistors 108 may be set as required. For example, when the transistors 108 are arranged according to the first preset pattern, the transistors 108 and the memory cells 102 are arranged in the same manner. When the transistors 108 are arranged according to the second preset pattern, the transistors 108 and the memory contact structures 104 are arranged in the same manner.

S204: Form transistor contact structures on the transistors respectively, where top portions of the transistor contact structures are arranged according to the first preset pattern.

Specifically, the transistor contact structures 110 are formed on the transistors 108 respectively. The transistor contact structures 110 are in contact with the transistors 108 and the memory cells 102, and the top portions of the transistor contact structures 110 are arranged according to the first preset pattern.

In an embodiment, bottom portions of the transistor contact structures 110 are arranged according to the third preset pattern. The bottom portion of the transistor contact structure 110 is arranged opposite to a top portion of the transistor contact structure 110. The third preset pattern includes the first preset pattern and the second preset pattern.

In an embodiment, an area of the top portion of the transistor contact structure 110 is larger than that of the bottom portion of the memory cell 102. In other embodiments, the area of the top portion of the transistor contact structure 110 is smaller than or equal to that of the bottom portion of the memory cell 102, so as to eliminate impact of the process deviation on the contact resistance between the transistor contact structure 110 and the memory cell 102.

Figure 7:
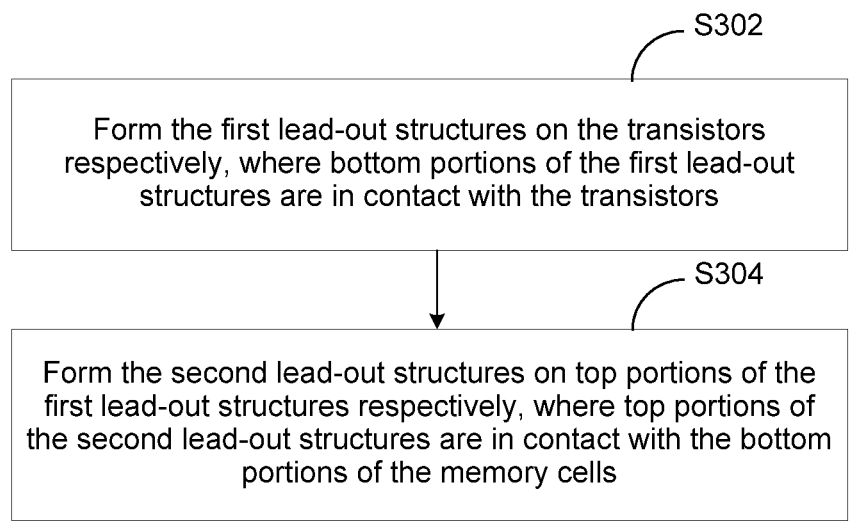
FIG. 7 is a schematic flowchart of forming a transistor contact structure on each transistor according to an embodiment.

FIG. 7 is a schematic flowchart of forming a transistor contact structure on each transistor according to an embodiment. As shown in FIG. 1 and FIG. 7, in an embodiment, the transistor contact structures 110 each include a first lead-out structure 202 and a second lead-out structure 204. Step S204 includes the following steps:

S302: Form the first lead-out structures 202 on the transistors 108 respectively, where bottom portions of the first lead-out structures 202 are in contact with the transistors 108.

Specifically, the bottom portion of the first lead-out structure 202 is in contact with the transistor 108 to lead out the transistor 108. For example, the bottom portion of the first lead-out structure 202 is connected to a drain of the transistor 108 to lead out the drain of the transistor 108. Typically, an area of the bottom portion of the first lead-out structure 202 is equal to that of the drain of the transistor 108.

S304: Form the second lead-out structures on top portions of the first lead-out structures respectively, where top portions of the second lead-out structures are in contact with the bottom portions of the memory cells.

Specifically, the bottom portion of the first lead-out structure 202 is the bottom portion of the transistor contact structure 110, and the top portion of the second lead-out structure 204 is the top portion of the transistor contact structure 110. In this case, the bottom portions of the first lead-out structures 202 are arranged according to the third preset pattern, and the top portions of the second lead-out structures 204 are arranged according to the first preset pattern. For example, the bottom portions of the first lead-out structure 202 are arranged according to the second preset pattern, and the top portions of the second lead-out structure 204 are arranged according to the first preset pattern; alternatively, the bottom portions of the first lead-out structure 202 and the top portions of the second lead-out structures 204 are both arranged according to the first preset pattern.

Figure 8:
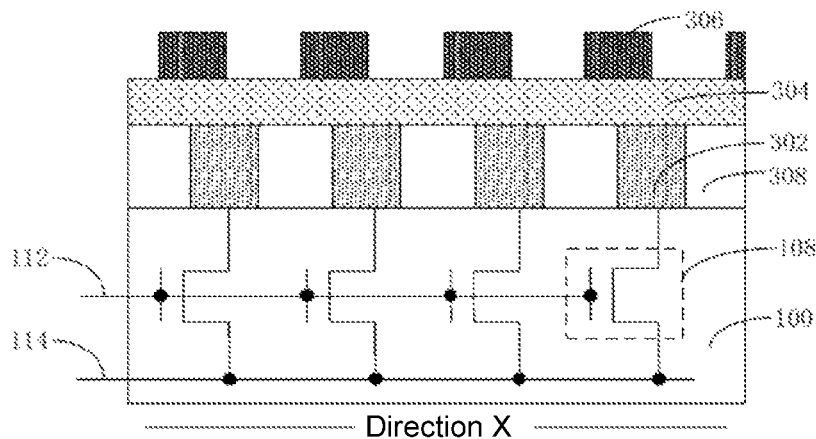
FIG. 8 is a schematic cross-sectional diagram of a semiconductor structure after a transistor contact mask layer is formed according to an embodiment.
Figure 9:
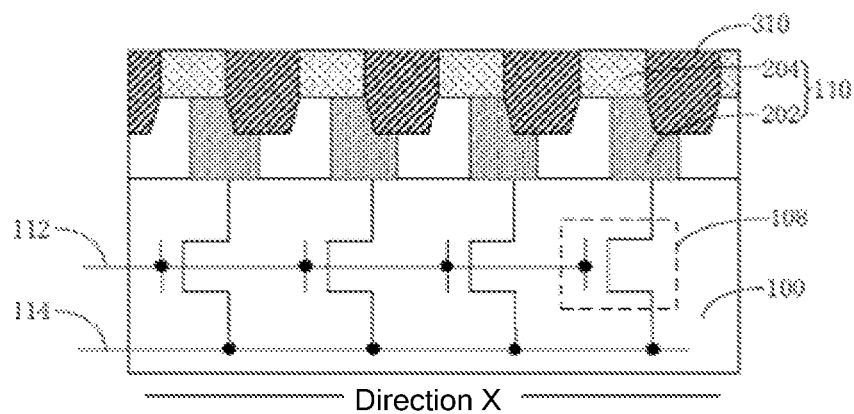
FIG. 9 is a schematic cross-sectional diagram of a semiconductor structure after transistor contact structures are formed according to an embodiment corresponding to FIG. 8.

FIG. 8 is a schematic cross-sectional diagram of a semiconductor structure after a transistor contact mask layer is formed according to an embodiment; FIG. 9 is a schematic cross-sectional diagram of a semiconductor structure after transistor contact structures are formed according to an embodiment corresponding to FIG. 8.

As shown in FIG. 8 and FIG. 9, in the first step, first contact structures 302, a first conductive film 304, and a transistor contact mask layer 306 are sequentially formed on the substrate 100 on which the transistors 108 have been formed. The first contact structure 302 is connected to the drain of the transistor 108, and a first dielectric layer 308 is filled between adjacent first contact structures 302, where an upper surface of the first dielectric layer 308 is flush with an upper surface of the first contact structure 302. The first conductive film 304 is located on the upper surface of the first contact structure 302, and the transistor contact mask layer 306 is located on the first conductive film 304, to define the shape and position of the transistor contact structure 110. In the second step, a part of the first conductive film 304, a part of the first contact structure 302, and a part of the first dielectric layer 308 are first removed through an etching process by using the transistor contact mask layer 306 as a mask, to obtain the first lead-out structure 202 formed by the remaining first contact structure 302, and the second lead-out structure 204 formed by the remaining first conductive film 304. It may be understood that, in some embodiments, only the first conductive film 304 and the first contact structure 302 that are not covered by the transistor contact mask layer 306 are removed through an etching process, to form the second lead-out structure 204 and the first lead-out structure 202. Next, a second dielectric layer 310 is filled between adjacent second lead-out structures 204, where an upper surface of the second dielectric layer 310 is flush with an upper surface of the second lead-out structure 204.

In an embodiment, an area of a bottom portion of the second lead-out structure 204 is not smaller than that of a top portion of the first lead-out structure 202, where the bottom portion of the second lead-out structure 204 is arranged opposite to the top portion of the second lead-out structure 204.

In an embodiment, a portion of the first lead-out structure 202 which is close to the bottom portion of the second lead-out structure 204 is a trapezoidal structure.

In an embodiment, a material of the first lead-out structure 202 and the second lead-out structure 204 includes one or more selected from a group consisting of polysilicon, a metal, a conductive metal nitride, a conductive metal oxide, and a metal silicide. The metal may be tungsten (W), nickel (Ni), or titanium (Ti); the conductive metal nitride includes titanium nitride (TiN); the conductive metal oxide includes iridium oxide ($IrO_2$); the metal silicide includes titanium silicide (TiSi). For example, the material of at least one of the memory contact structure 104, the first lead-out structure 202, and the second lead-out structure 204 is different from others. For example, the material of the first lead-out structure 202 is different from the material of the memory contact structure 104 and the second lead-out structure 204. In practical application, a same material may be selected as required to manufacture the memory contact structure 104, the first lead-out structure 202, and the second lead-out structure 204.

In an embodiment, the memory cell 102 includes a ferroelectric memory cell, a magnetoresistive memory cell, a resistance change memory cell, or a phase change memory cell.

In an embodiment, the bottom portions of the first lead-out structure 202 are arranged according to the second preset pattern, and the top portions of the second lead-out structure 204 are arranged according to the first preset pattern.

Figure 10:
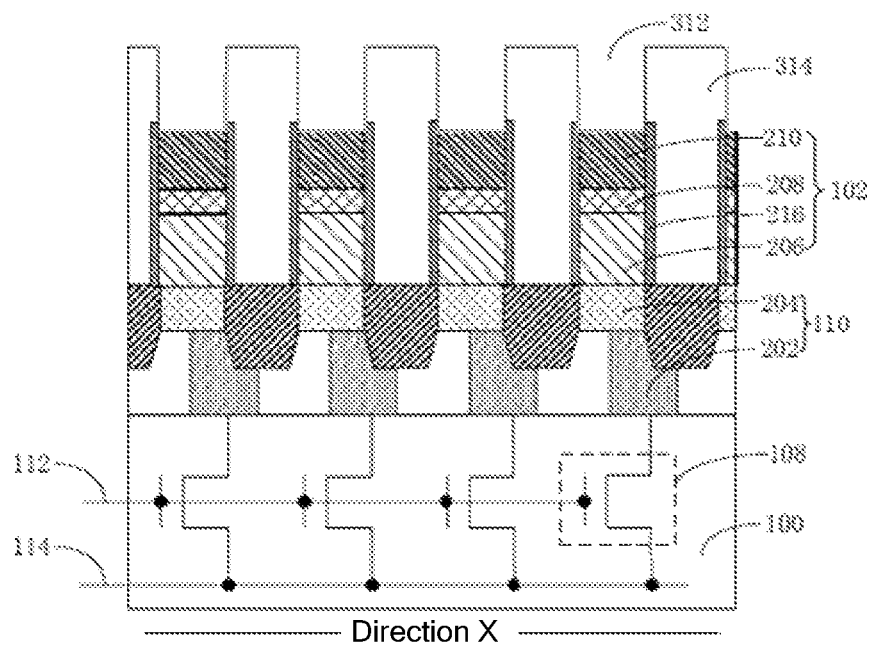
FIG. 10 is a schematic cross-sectional diagram of a semiconductor structure after memory cells are formed according to an embodiment corresponding to FIG. 9.
Figure 11:
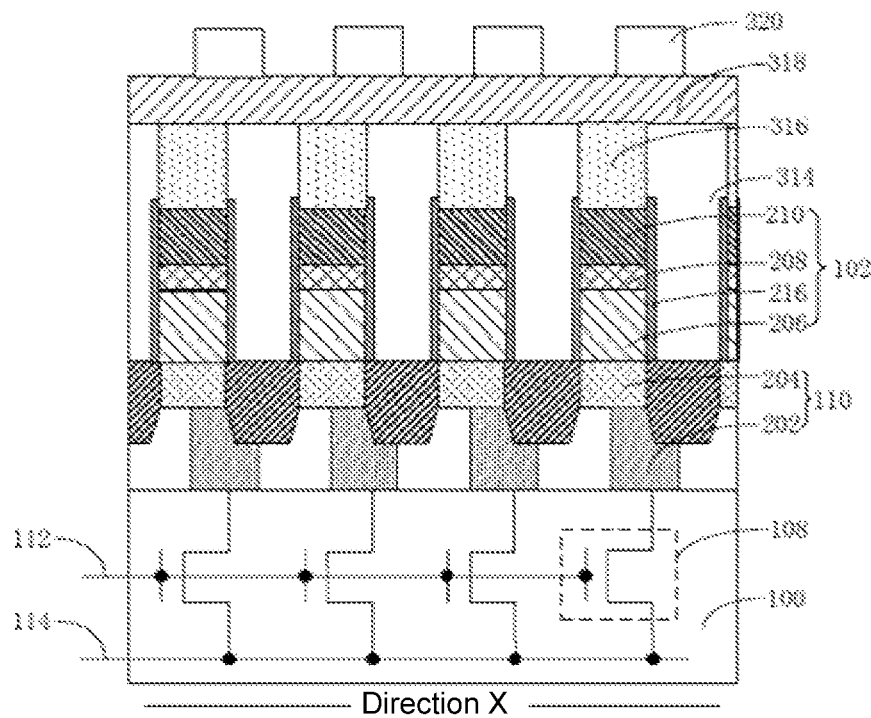
FIG. 11 is a schematic cross-sectional diagram of a semiconductor structure after a bit line mask layer is formed according to an embodiment corresponding to FIG. 10.
Figure 12:
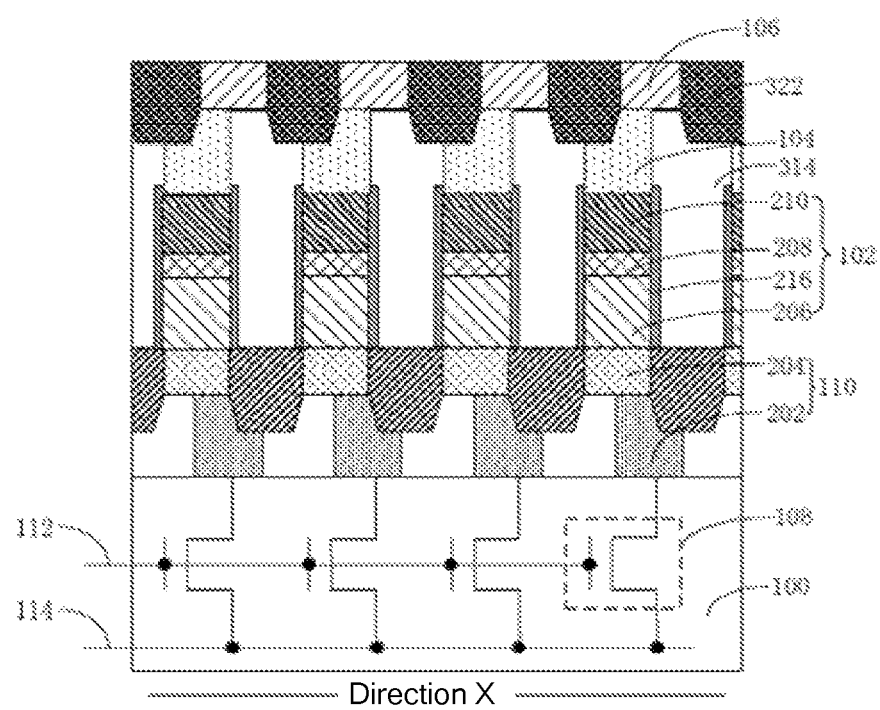
FIG. 12 is a schematic cross-sectional diagram of a semiconductor structure after a bit line structure is formed according to an embodiment corresponding to FIG. 11.

FIG. 10 is a schematic cross-sectional diagram of a semiconductor structure after memory cells are formed according to an embodiment corresponding to FIG. 9; FIG. 11 is a schematic cross-sectional diagram of a semiconductor structure after a bit line mask layer is formed according to an embodiment corresponding to FIG. 10; and FIG. 12 is a schematic cross-sectional diagram of a semiconductor structure after a bit line structure is formed according to an embodiment corresponding to FIG. 11. As shown in FIG. 10, FIG. 11, and FIG. 12, in the third step, memory cells 102 are formed on the second lead-out structures 204 respectively. For example, if the memory cell 102 is a magnetoresistive memory cell, the memory cell 102 is formed through the following steps: First, a fixed layer structure is formed on the upper surface of the second lead-out structure 204 through a common deposition process, such as a physical vapor deposition process. For example, the fixed layer structure is a laminated structure consisting of a plurality of films, including a seed layer, a $[Co(x)/Pt(y)]_m$ laminated layer, a Ru or Ir metal layer, a $[Co(x)/Pt(y)]_m$ laminated layer, a Ta metal layer, and a CoFeB metal layer that are sequentially formed on the upper surface of the second lead-out structure 204. Next, a non-magnetic isolation structure and a free layer structure are sequentially formed on the upper surface of the fixed layer structure. For example, the material of the non-magnetic isolation structure includes MgO and $Al_2O_3$; the material of the free layer structure includes CoFe, NiFe, NiFeCo, and CoFeB. Then, an annealing process is performed, and excess parts of the free layer structure, the non-magnetic isolation structure, and the fixed layer structure are removed through a photoetching process, to obtain the free layer 210 formed by the remaining free layer structure, the non-magnetic isolation layer 208 formed by the remaining non-magnetic isolation structure, and the fixed layer 206 formed by the remaining fixed layer structure. Typically, an area of the bottom portion of the fixed layer 206 is equal to that of the top portion of the second lead-out structure 204. Then, a protection structure, such as a silicon nitride structure, is formed on sidewalls of the fixed layer 206, the non-magnetic isolation layer 208, and the free layer 210. The protection structure extends along the sidewall of the free layer 210 to cover the upper surface of the free layer 210. Next, third dielectric structures are formed on the substrate 100, where each third dielectric structure is filled between adjacent free layers 210, and an upper surface of the third dielectric structure is higher than an upper surface of the protection structure. Further, the protection structure and the third dielectric structure that are right above the free layer 210 are removed through a photoetching process, to obtain a memory contact trench 312 above the free layer 210, a protective layer 216 formed by the remaining protection structure, and a third dielectric layer 314 formed by the remaining third dielectric structure. In the fourth step, a memory contact layer 316 is filled in the memory contact trench 312, where an upper surface of the memory contact layer 316 is flush with an upper surface of the third dielectric layer 314. In the fifth step, a bit line structure layer 318 is formed on the upper surface of the third dielectric layer 314. In the sixth step, a bit line mask layer 320 is formed on the bit line structure layer, where the bit line mask layer 320 defines shapes and positions of the bit line structure 106 and the memory contact structure 104. In other embodiments, before the fifth step, the method includes: before forming, on the upper surface of the third dielectric layer 314, a memory mask layer for defining the shape and position of the memory contact structure 104, removing a part of the memory contact layer 316 through a photoetching process, to obtain the memory contact structure 104 formed by the remaining memory contact layer 316. In this case, the bit line mask layer 320 is only used for defining the shape and position of the bit line structure 106. In the seventh step, a part of the bit line structure layer, a part of the memory contact layer 316, and a part of the third dielectric layer 314 are removed through an etching process by using the bit line mask layer 320 as a mask, to obtain the bit line structure 106 formed by the remaining bit line structure layer and the memory contact structure 104 formed by the remaining memory contact layer 316. In the eighth step, a fourth dielectric layer 322 is filled between adjacent bit line structures 106, where an upper surface of the fourth dielectric layer 322 is flush with the bit line structure. For example, materials of the first dielectric layer 308, the second dielectric layer 310, the third dielectric layer 314, and the fourth dielectric layer 322 include silicon dioxide, silicon oxynitride, and silicon nitride.

Embodiments of the present disclosure are described herein with reference to cross-sectional views as schematic diagrams of idealized embodiments (and intermediate structures) of the present disclosure, such that variations shown in the shapes and due to, for example, manufacturing techniques and/or tolerances can be contemplated. Therefore, the embodiments of the present disclosure should not be limited to the specific shapes of the regions shown herein, but include shape deviations due to, for example, manufacturing techniques. For example, an injection region displayed as a rectangle usually has a circular or curved feature and/or injection concentration gradient at an edge of the region, rather than a binary change from the injection region to a non-injection region. Similarly, a buried region formed by injection can lead to some injection in a region between the buried region and a surface through which the injection is carried out. Therefore, the regions shown in the figure are schematic in nature, and their shapes are not intended to show the actual shapes of the regions of the device and limit the scope of the present disclosure.

In the specification, the description of terms such as "some embodiments", "other embodiments", "desirable embodiments" and the like means that a specific feature, structure, material or characteristic described in combination with the embodiment(s) or example(s) are included in at least one embodiment or example of the present application. In this specification, the schematic description of the above terms does not necessarily refer to the same embodiment or example.

The technical characteristics of the foregoing embodiments can be employed in arbitrary combinations. To provide a concise description of these embodiments, not all possible combinations of all technical characteristics of the embodiments are described; however, these combinations of technical characteristics should be construed as disclosed in the description as long as no contradiction occurs.

Only several embodiments of the present application are described in detail above, but they should not therefore be construed as limiting the scope of the present application. It should be noted that those of ordinary skill in the art can further make variations and improvements without departing from the conception of the present application. These variations and improvements all fall within the protection scope of the present application. Therefore, the protection scope of the present disclosure should be subject to the protection scope defined by the claims.

The invention claimed is:

1. A semiconductor structure, comprising:
a substrate, having a first surface;
a plurality of memory cells, located above the first surface of the substrate and arranged according to a first preset pattern;
a plurality of transistors, located between the substrate and the memory cells, the transistors correspond to the memory cells in a one-to-one manner, and the transistors are arranged according to a second preset pattern different to the first preset pattern, the second preset pattern comprises an array with a plurality of rows and columns;
a plurality of transistor contact structures, located between the transistors and the memory cells and in contact with the transistors and the memory cells, wherein top portions of the transistor contact structures are arranged according to the first preset pattern, bottom portions of the transistor contact structures are arranged according to the second preset pattern; and
a plurality of memory contact structures, corresponding to the memory cells in a one-to-one manner, wherein bottom portions of the memory contact structures are in contact with top portions of the memory cells, and top portions of the memory contact structures are arranged according to the second preset pattern;
wherein the bottom portions of the memory contact structures are arranged opposite to the top portions of the memory contact structures.

2. The semiconductor structure according to claim 1, wherein the first preset pattern comprises a regular hexagon, and the memory cells are located at vertex positions and a central position of the regular hexagon.

3. The semiconductor structure according to claim 1, wherein the bottom portions of the memory contact structures are arranged according to the first preset pattern.

4. The semiconductor structure according to claim 1, the semiconductor structure further comprises:
a plurality of bit line structures, wherein any one of the bit line structures is in contact with the top portion of the memory contact structure in a same column, and the bit line structure is in a straight-line shape.

5. The semiconductor structure according to claim 1, wherein
the bottom portion of the transistor contact structure is arranged opposite to the top portion of the transistor contact structure.

6. The semiconductor structure according to claim 1, wherein the transistor contact structures each comprise:
a first lead-out structure, wherein a bottom portion of the first lead-out structure is in contact with the transistor; and
a second lead-out structure, wherein a bottom portion of the second lead-out structure is in contact with a top portion of the first lead-out structure, and a top portion of the second lead-out structure is the top portion of the transistor contact structure;
wherein the bottom portion of the first lead-out structure is arranged opposite to the top portion of the first lead-out structure, and the bottom portion of the second lead-out structure is arranged opposite to the top portion of the second lead-out structure.

7. The semiconductor structure according to claim 6, wherein an area of the bottom portion of the second lead-out structure is not smaller than that of the top portion of the first lead-out structure.

8. The semiconductor structure according to claim 1, wherein the memory cell comprises a ferroelectric memory cell, a magnetoresistive memory cell, a resistance change memory cell, or a phase change memory cell.

9. A manufacturing method of a semiconductor structure, comprising:
providing a substrate, wherein the substrate has a first surface;
forming a plurality of transistors on the first surface of the substrate, wherein the transistors are arranged according to a second preset pattern different to the first preset pattern, the second preset pattern comprises an array with a plurality of rows and columns;
forming transistor contact structures on the transistors respectively, wherein top portions of the transistor contact structures are arranged according to the first preset pattern, bottom portions of the transistor contact structures are arranged according to the second preset pattern;
forming a plurality of memory cells above the first surface of the substrate, wherein the memory cells are arranged according to a first preset pattern, wherein the transistor contact structures are in contact with the transistors and the memory cells, and the transistors correspond to the memory cells in a one-to-one manner; and
forming memory contact structures on top portions of the memory cells respectively, wherein top portions of the memory contact structures are arranged according to a second preset pattern.

10. The manufacturing method according to claim 9, wherein the first preset pattern comprises a regular hexagon, and the memory cells are located at vertex positions and a central position of the regular hexagon.

11. The manufacturing method according to claim 9, wherein bottom portions of the memory contact structures are in contact with the top portions of the memory cells respectively, and the bottom portions of the memory contact structures are arranged according to the first preset pattern; and
the bottom portion of the memory contact structure is arranged opposite to the top portion of the memory contact structure.

12. The manufacturing method according to claim 9, the manufacturing method further comprises:
  forming a plurality of bit line structures on the top portions of the memory contact structures respectively, wherein any one of the bit line structures is in contact with the top portion of the memory contact structure in a same column, and the bit line structure is a straight-line shape.

13. The manufacturing method according to claim 9, wherein
  the bottom portion of the transistor contact structure is arranged opposite to the top portion of the transistor contact structure.

14. The manufacturing method according to claim 9, wherein the transistor contact structures each comprise a first lead-out structure and a second lead-out structure, and the forming transistor contact structures on the transistors respectively comprises:
  forming the first lead-out structures on the transistors respectively, wherein bottom portions of the first lead-out structures are in contact with the transistors; and
  forming the second lead-out structures on top portions of the first lead-out structures respectively, wherein top portions of the second lead-out structures are in contact with the bottom portions of the memory cells;
  wherein the bottom portion of the first lead-out structure is arranged opposite to the top portion of the first lead-out structure.

15. The manufacturing method according to claim 14, wherein an area of the bottom portion of the second lead-out structure is not smaller than that of the top portion of the first lead-out structure; and
  the bottom portion of the second lead-out structure is arranged opposite to the top portion of the second lead-out structure.

16. The manufacturing method according to claim 15, wherein the bottom portions of the first lead-out structures are arranged according to the second preset pattern, and the top portions of the second lead-out structures are arranged according to the first preset pattern.

\* \* \* \* \*